(12) United States Patent
Nakayama et al.

(10) Patent No.: US 8,310,146 B2
(45) Date of Patent: Nov. 13, 2012

(54) ORGANIC ELECTROLUMINESCENT DEVICE, LIQUID CRYSTAL DISPLAY AND ILLUMINATING DEVICE

(75) Inventors: Tomoyuki Nakayama, Tokyo (JP); Nobuhiko Takashima, Tokyo (JP); Masaaki Murayama, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 598 days.

(21) Appl. No.: 12/090,387

(22) PCT Filed: Oct. 13, 2006

(86) PCT No.: PCT/JP2006/320472
§ 371 (c)(1),
(2), (4) Date: Apr. 16, 2008

(87) PCT Pub. No.: WO2007/049470
PCT Pub. Date: May 3, 2007

(65) Prior Publication Data
US 2009/0279285 A1 Nov. 12, 2009

(30) Foreign Application Priority Data
Oct. 27, 2005 (JP) ................. 2005-312467

(51) Int. Cl.
*H01J 1/62* (2006.01)
(52) U.S. Cl. ...................................... 313/504
(58) Field of Classification Search ........... 313/502–504
See application file for complete search history.

(56) References Cited

U.S. PATENT DOCUMENTS

| 2002/0197511 | A1* | 12/2002 | D'Andrade et al. | 428/690 |
| 2004/0031977 | A1* | 2/2004 | Brown et al. | 257/222 |
| 2005/0057150 | A1* | 3/2005 | Kim et al. | 313/504 |
| 2005/0112403 | A1* | 5/2005 | Ju et al. | 428/690 |

FOREIGN PATENT DOCUMENTS

| JP | 2003017244 | 1/2003 |
| JP | 2003217829 | 7/2003 |
| JP | 2005071929 | 3/2005 |
| JP | 2005142119 | 6/2005 |

OTHER PUBLICATIONS

Li et al. "A High Tg Carbozole-Based Hole-Transporting Material for Organic Light-Emitting Devices", Chem. Mater, 2005, vol. 17, pp. 1208-1212.*  Adachi et al. "Nearly 100% internal phosphorescence efficiency in an organic light emitting device", Journal of Applied Physics, 2001, vol. 90, No. 10, pp. 5048-5051.*
Schwartz et al. "Highly efficient white organic light emitting diodes comprising an interlayer to separate fluorescent and phosphorescent regions", Applied Physics Letters, 2006, vol. 89.*
Shizuo Tokito, Chihaya Adachi et al., Yuki EL Display, first edition, Ohnnsha, Ltd. Hakko, Aug. 20, 2004, pp. 137 to 139.

* cited by examiner

*Primary Examiner* — Anh Mai
*Assistant Examiner* — Brenitra Lee
(74) *Attorney, Agent, or Firm* — Lucas & Mercanti, LLP

(57) ABSTRACT

This invention provides an organic electroluminescent element that has a thin and compact sealing structure and is excellent in heat resistance in sealing, particularly a high-brightness organic electroluminescent element comprising a phosphorescence emitting substance, and a liquid crystal display device and lighting equipment using the same. The organic electroluminescent element comprises a substrate and a first electrode, one or more organic layers including a luminescent layer, and a second electrode provided on the substrate. An adhesive layer is disposed on the whole area of a light emitting surface and remote from the light takeout side in the organic electroluminescent element, and a flexible film having a barrier film is applied thereto to form the light emitting surface. The organic electroluminescent element is characterized in that at least one of the luminescent material contained in the luminescent layer is phosphorescence emitting substance, and not less than 80% by mass of the organic material constituting the organic layer has a glass transition temperature of 100° C. or above.

9 Claims, 3 Drawing Sheets

LIGHT TAKING OUT SIDE

LIGHT TAKING OUT SIDE

LIGHT TAKING OUT SIDE

LIGHT

LIGHT

ORGANIC ELECTROLUMINESCENT DEVICE, LIQUID CRYSTAL DISPLAY AND ILLUMINATING DEVICE

This is a U.S. National Phase Application under 35 U.S.C. 371 of International Application PCT/JP2006/320472 filed on Oct. 13, 2006.

This Application claims the priority of Japanese Application No. 2005-312467, filed Oct. 27, 2005, the entire content of which is hereby incorporated by reference.

TECHNICAL FIELD

The present invention relates to an organic electroluminescent element, a liquid crystal display and an illuminating device.

TECHNICAL BACKGROUND

Electroluminescent displays are used as light emitting type electronic display device (ELD). As the constituting element of the ELD, an inorganic electroluminescent element (inorganic EL element) and an organic electroluminescent device (organic EL device) are cited. The inorganic EL device has been used as a planar light source though high alternative voltage is required for driving such the light emitting device.

The organic EL device is an element having a light emission layer placed between a cathode and an anode, in which electrons and positive holes are injected into the light emission layer and excitons are generated by recombination of them, and light (fluorescence or phosphorescence) is emitted on the occasion of quenching of the excitons. Such the device is noted because which can emit light by application of a voltage of several to several tens volts, and has wide viewing angle and high visibility since it is a self light emission type, and is completely solid state thin device suitable for space saving and portable appliance.

It is important character of the organic EL device that the element is a planar light source different from ordinary practically used principal light sources such as light emission diodes and cold cathode ray tubes. As the use for effectively utilizing such the character, illuminating light source and backlight for various displays are cited. Particularly, such the element is suitably used for the backlight of liquid crystal full color display which is strongly demanded in recent years.

When the element is used as the backlight of the full color display, the element is used as a source of white light. The following methods are applicable for obtaining white light by the organic EL device; a method in which plural light emission materials are used in an element so as to emit white light by color mixing, a method in which plural colors pixels such as pixels of blue, green and red are separately coated and simultaneously lighted for obtaining white light, and a method in which a color conversion dye such a combination of a blue light emission material and a color conversion fluorescent dye is used for obtaining white light.

The method in which the color emission materials are prepared as one element for obtaining white light is advantageous for the use of backlight from the viewpoint of the requirement for the backlight such as low cost, high production efficiency and simple driving method.

Such the method includes in detail a method using complementary two color materials such as a blue light emission material and a yellow color emission material in one device to obtain by color mixing and that using three color materials to obtain white light by color mixing. However, the method using three colors, blue, green and red, light emission materials is preferable from the viewpoint of color reproducibility and reducing light loss by color filter.

It has been reported that a white light emission organic EL element can be obtained by doping the fluorescent materials reach emits blue, green or red light with high efficiency as the light emission material; cf. Patent Publications 1 and 2 for example.

Moreover, development of phosphorescent light emission material is made progress since an element showing high luminance light emission can be obtained; cf. Non-patent Publications 1 to 3 for example. Such the effect causes that the light emission efficiency of the phosphorescent light emission material can be raised for 4 times in maximum of that of the fluorescent light emission material because the upper limit of internal quantum efficiency becomes 100% by the later mentioned formation ratio of the singlet to triplet exciton and the internal conversion from the singlet exciton to the triplet exciton compared with the case of the light emission in usual fluorescent material in which the light is generated from singlet excited state and the formation probability of the light emission exciton species is 25% since the formation ratio of the singlet exciton to triplet exciton is 1:3.

The organic EL element is markedly deteriorated in its light emission property by exposure to air or moisture. The organic EL element employing phosphorescence light mission material is also deteriorated markedly by exposure to air or moisture.

An organic EL panel is proposed which is formed by a method in which an organic layer is sealed with a sealing cap can such as a metal can by sticking it to the organic EL substrate with adhesive for the purpose of preventing to exposure to air or moisture to attain high durability and long life. This to provide sealing space in which inactive gas is filled and moisture absorption agent is also provided. (Reference is made a sectional view of illumination device employing conventional organic EL element of FIG. 7). Consequently though the organic EL element as itself is a very thin element, the device is thick as a whole to have thickness of the space to provide the sealing parts and moisture absorption agent.

An organic EL panel is proposed which employs sealing film having barrier characteristics capable to form a thin EL element on the other hand (for example, Patent Document 5).

Patent Document 5 proposes to seal by moisture proof film. Volume within sealed space changes by expansion and shrink due to temperature or atmospheric pressure since the sealed space is atmosphere pressure, and, adhesion part is suffered from stress which causes cracks or peeling at adhesion part by repeating the expansion and shrink, and therefore, oxygen or moisture penetrated from the outside, consequently the element is deteriorated. Further, pressure change by expansion and shrink influences to a barrier film to induce generation of cracks of the barrier layer.

This invention is performed to obtain a thin and compact organic EL device having high durability, particularly one using phosphorescent light emission material Patent Document 1: JP A H06-207170
Patent Document 2: JP A 2004-235168
Patent Document 3: U.S. Pat. No. 6,097,147
Patent Document 4: WO 02/5,011,013
Patent Document 2: JP A H11-162634
Non-Patent Document 1: M. A. Baldo et al., Nature, 395, 151-154 (1998)
Non-Patent Document 2: M. A. Baldo et al., Nature, 403, 750-753 (2000)

DISCLOSURE OF THE INVENTION

Problems to be Solved

An object of the invention is to provide an organic electroluminescent device having thin and compact sealing structure, excellent in heat resistance during sealing process and less non-uniform color, particularly an organic electroluminescent device having high luminescent phosphorescent material, a liquid crystal display and an illuminating element using the organic electroluminescent device.

Means for Solving the Problem

The above problem of the invention is attained by the following constitution.
1. An organic EL device comprising an organic EL element having, on a substrate, a first electrode, one or more organic layers including a light emission layer formed on the first electrode, and a second electrode, in which an adhesion layer is provided on a whole area of one side a light emitting surface, the one side being opposite to a surface from which a light is taking out and a flexible film having a barrier layer is allowed to adhere so that the light emitting surface is sealed, wherein at least one of light emission material contained in the light emission layer is a phosphorescence light emission material, and 80% by mass or more of an organic material composed of the whole organic layer has a glass transition point of 100° C. or higher.
2. The organic EL device as described in the item 1, wherein the light emission layer comprises three light emission materials each having an emission maximum wavelength of 440 to 490 nm, 500 to 540 nm and 600 to 640 nm, and at least two of them are each a phosphorescence light emission material.
3. The organic EL device as described in the item 1 or 2, wherein the substrate is a flexible film having an oxygen permeability of not more than $10^{-1}$ ml/m²·24 h·MPa and a water vapor permeability of not more than $10^{-3}$ g/m²·24 h.
4. The organic EL device as described in one of the items 1 to 3, which further has an inorganic layer having oxygen permeability not more than 1 ml/m²·24h·MPa and water vapor permeability not more than $10^{-2}$ g/m²·24 h between the organic layer which is not covered with the second electrode and the adhesion layer.
5. A liquid crystal display which has the organic EL device described in one of the items 1 to 4, as a backlight.
6. An illuminating device which has an organic EL device described in one of the items 1 to 4, as a light source.

Advantage of the Invention

An organic electroluminescent device can be provided which has thin and compact sealing structure, excellent in heat resistance during sealing process and less non-uniform color, particularly an organic electroluminescent device having high luminescent phosphorescent material, a liquid crystal display and an illuminating element using the organic electroluminescent device, by this invention.

EXPLANATION OF THE SYMBOLS

Figure 1:
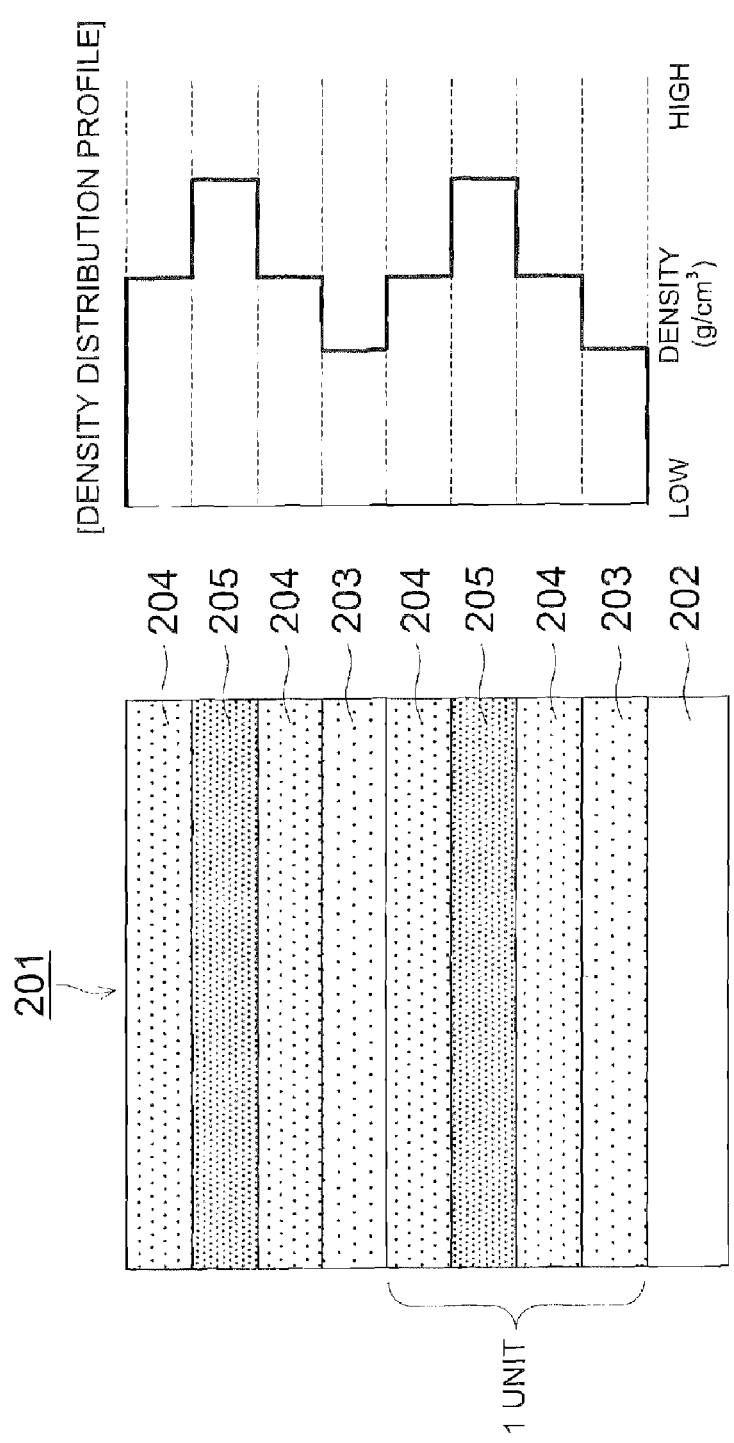
FIG. 1 shows a schematic drawing illustrating an example of layer arrangement of the barrier layer and its density profile.

101: Organic EL device
102: Glass cover
105: Cathode
106: Organic EL layer
107: Glass substrate having transparent electrode
108: Nitrogen gas
109: Moisture capturing agent
201: Barrier layer
202: Substrate
203: Low density layer
204: Intermediate density layer
205: High density layer
230: Plasma discharging treatment apparatus
231: Plasma discharging treatment chamber
235: Rotatable roller electrode
236: Fixed columnar electrode group
240: Electric field applying means
250: Gas supplying means
251. Gas generation device
253: Gas discharging opening
260: Electrode temperature controlling means
F: Substrate
P: Pump
261: Piping
266: Nip roller
267: Guide roller
268 and 269: parting plate
301: Base
302: First electrode (Transparent electrode, Anode)
303: Organic layer
304: second electrode (Cathode)
305. Adhesion layer
306: Flexible film having barrier layer
307: Inorganic compound layer

THE BEST EMBODIMENT FOR EMBODYING THE INVENTION

Figure 4:
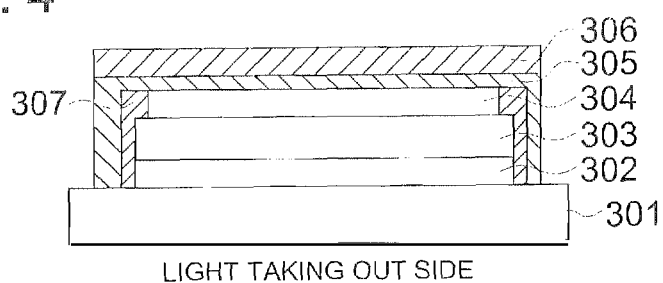
FIG. 4 shows another example of the embodiment of this invention.

Each composing element according to this invention will be described in detail in sequence.
<<Organic EL Device>>
The organic EL device of this invention is described.
<<Light Emission and Front Luminance>>
The color of the light emitted from the organic EL device of this invention and the compound relating to the organic EL device is defined by the color obtained by applying the results measured by spectral radiation luminance meter CS-100, manufacture by Konica Minolta Sensing Inc., to CIE coordinate according to FIG. 4.16 on p. 108 of New Edited Coloring Science Handbook, edited by The Color Science Association of Japan, University of Tokyo Press (1985).

The chromaticity of the organic EL device of the invention measured at a front luminance of 1,000 cd/m² at a viewing field angle of 2° without any light condensing means such as a light condensing sheet is preferably at X=0.33±0.07 and Y=0.33±0.77 in CIE1931 chromaticity coordinates.

The organic EL device is preferably has at least three light emission layers each different from each other in the emitting light wavelength, each of which emits light having the emission maximum wavelength of from 440 to 490 nm, hereinafter referred to as blue region, that of from 500 to 540 nm, hereinafter referred to as green region, and that of from 600 to 640 nm, hereinafter referred to as red region, respectively.

It is preferable that the entire spectrum of emitting light of the element using such the light emission layers has the emission maximum wavelength of from 440 to 490 nm, 500 to 540 nm and 600 to 640 nm, respectively, in this invention. Moreover, it is preferable for the use of the liquid crystal display that the minimum intensity of emitting light between the each of the emission maximum is 60% or less of the emission intensity of the adjacent wavelength region and not more than 45% between the blue region and the green region or the green region and the red region. It is also preferable that the minimum intensity wavelength between the blue region and the green region is within the range of from 470 to 510 nm and between the green region and the red region is within the range of from 570 to 600 nm. When the liquid crystal display is constituted in combination with a color filter, the spectral transmitting property and the minimum intensity wavelength is preferably controlled so as to satisfy the following relation.

$$\lambda_{BG}-20 \text{ nm} \leq \lambda_1 \leq \lambda_{BG}+10 \text{ nm}$$

$$\lambda_{GR}-20 \text{ nm} \leq \lambda_2 \leq \lambda_{GR}+10 \text{ nm}$$

In the above, $\lambda_1$ is the minimum intensity wavelength between the blue region and the green region, $\lambda_2$ is the minimum intensity wavelength between the green region and the red region, $\lambda_{BG}$ is a wavelength where the product of the transparency of the blue pixel in the region of from 450 to 550 nm and that of the green pixel is made largest and $\lambda_{GR}$ is a wavelength where the product of the transparency of the green pixel in the region of from 450 to 550 nm and that of the red pixel is made largest.

The light emission layer relating to the Organic EL device of the invention is described in detail in the later description of the layer constitution of the organic EL element.

Preferable concrete examples of the layer constitution of the organic EL device of the invention are listed below, though the invention is not limited to them.

(i) Anode/Light emission layer unit/Electron transfer layer/Cathode (ii) Anode/Positive hole transfer layer/Light emission layer unit/Electron transfer layer/Cathode (iii) Anode/Positive hole transfer layer/Light emission layer unit/Positive hole blocking layer/Electron transfer layer/Cathode (iv) Anode/Positive hole transfer layer/Light emission layer unit/Positive hole blocking layer/Electron transfer layer/Cathode buffer layer/Cathode (v) Anode/Anode buffer layer/Positive hole transfer layer/Light emission layer unit/Positive hole blocking layer/Electron transfer layer/Cathode buffer layer/Cathode In the above, the light emission layer unit preferably has at least three light emission layer different from each other in the wavelength of emitting light and non-light emission layers between the each of layers.

The materials used for the organic EL device of this invention is not critical, however, 80% by mass or more of the organic material employed in the whole organic layers is compounds having glass transition point of 100° C. or higher, and preferably 90% by mass or more of the organic material is compounds having glass transition point of 100° C. or higher. Further the glass transition point is preferably 120° C. or higher.

<<Light Emission Layer>>

The light emission layer relating to the invention is a layer in which electrons and positive holes each injected from the electrodes or the electron transfer layer and the positive hole transfer layer, respectively, are recombined to emit light and the portion of light emission may be inside of the layer or the interface of the light emission layer and the adjacent layer.

The light emission layer relating to the invention preferably has at least three light emission layers, namely, the blue light emission layer, the green light emission layer and the red light emission layer each having the emission maximum within the blue region, green and red region, respectively even though the structure of the light emission layer of the invention is not specifically limited as long as the emission maximum wavelength of the emitted light is satisfies the above conditions.

When the number of the light emission layer is four or more, plural layers having the same light emission spectrum or the emission maximum wavelength as another layer may be contained.

In the invention, the layers each having the emission maximum wavelength of 440 to 490 nm, 500 to 540 nm and 600 to 640 nm are referred to as blue light emission layer, green light emission layer and red light emission layer, respectively.

It is preferable that non-light emission intermediate layers are provided between each of the light emission layers.

In the invention, at least one of the light emission materials is a phosphorescent light emission material.

Further it is preferred that the organic EL device includes at least three light emission materials having different region having maximum wavelength of from 440 to 490 nm (blue region), 500 to 540 nm (green region) and 600 to 640 nm (red region), and it is preferable that at least two of them are phosphorescent light emission materials.

The total thickness of the light emission layer is preferably not more than 30 nm. It is more preferable to have 20 nm because lower driving voltage can be utilized. In the invention, the total thickness of the light emission layers is a thickness including the non-light emission intermediate layers when the intermediate layers are provided.

The thickness of individual light emission layer is preferably controlled within the range of from 2 to 25 nm and more preferably from 2 to 20 nm. The relation between the thickness of each of the blue, green and red light emission layers is not specifically limited.

The light emission layer can be prepared by forming a layer of the later-mentioned light emission dopant and the host compound by known method such as a vacuum deposition method, spin coating method, LB method and ink-jet method.

In the invention, plural light emission materials may be mixed in each of the layers and the phosphorescent light emission dopant and the fluorescent light emission dopant may be used in the same layer as long as the foregoing spectral conditions can be maintained.

In the invention, it is preferable that the light emission layer is preferably constituted by containing the host compound and the light emission dopant (also referred as to light emission dopant compound) so as to emit light from the dopant.

As the host compound to be contained in the light emission layer of the organic EL device of this invention, a compound is preferable which has a phosphorescent quantum efficiency of the fluorescent light emission of less than 0.1 and more preferably less than 0.01. The weight ratio of the host compound in the compounds contained in the light emission layer is preferably not less than 20%.

As the host compound, known host compounds may be used singly or in a combination of plural kinds thereof. The transfer of charge can be controlled by the combination use of the host compounds so as to raise the efficiency of the organic EL device. Moreover, mixing of different emitted light is made possible by the use of plural kinds of light emission material so as that optional color light can be obtained.

The light emission host compound may be a known low molecular weight compound, a polymer compound having a repeating unit or a low molecular compound having a polymerizable group such as a vinyl group and an epoxy group (vapor deposition polymerizable light emission host).

As the known host compound, a compound is preferable which has positive hole transferring ability and electron transferring ability, an ability to prevent shift of emitted light to loner wavelength side and high glass transition point Tg. The glass transition point Tg is a value obtained by the method according to JIS-K-7121 using differential scanning colorimetry (DSC).

As known examples of an emission host, compounds described in the following Documents are preferable: For example, JP-A 2001-257076, JP-A 2002-308855, JP-A 2001-313179, JP-A 2002-319491, JP-A 2001-357977, JP-A 2002-334786, JP-A 2002-8860, JP-A 2002-334787, JP-A 2002-15871, JP-A 2002-334788, JP-A 2002-43056, JP-A 2002-334789, JP-A 2002-75645, JP-A 2002-338579, JP-A 2002-105445, JP-A 2002-343568, JP-A 2002-141173, JP-A 2002-352957, JP-A 2002-203683, JP-A 2002-363227, JP-A 2002-231453, JP-A 2003-3165, JP-A 2002-234888, JP-A 2003-27048, JP-A 2002-255934, JP-A 2002-260861, JP-A 2002-280183, JP-A 2002-299060, JP-A 2002-302516, JP-A 2002-305083, JP-A 2002-305084 and JP-A 2002-308837.

The emission dopant of this invention will now be described.

As an emission dopant used in this invention, a fluorescent compound or a phosphorescence emitting dopant (also referred to as a phosphorescent compound or a phosphorescence emitting compound) are employed.

The phosphorescence emitting material is a compound which emits light from the excited triplet, which is specifically a compound which emits phosphorescence at room temperature (25° C.), and is defined to exhibit a phosphorescent quantum yield at 25° C. of not less than 0.01, and the phosphorescent quantum yield at 25° C. is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield in a solution can be measured employing various kinds of solvents. The phosphorescence emitting material of the present invention is a compound, in which the phosphorescent quantum yield measured employing any one of the solvents falls within the above-described range (0.01 or more).

The light emission of the phosphorescence emitting material is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound. However, in each type, energy level of the phosphorescent compound in excited state is lower than that of the host in excited state.

The phosphorescence emitting material can be optionally selected from the known phosphorescence emitting materials used in the light emission layer of an organic EL element.

The phosphorescence emitting material according to this invention is preferably a complex containing a metal of Group 8-10 of the periodic table, and more preferably an iridium compound, an osmium compound, a platinum compound (a platinum complex compound) or a rare-earth metal complex. Of these, most preferable is an iridium compound.

Specific examples of a compound used as a phosphorescence emitting material are shown below, however, the present invention is not limited thereto. These compounds can be synthesized, for example, according to a method described in Inorg. Chem., 40, 1704-1711.

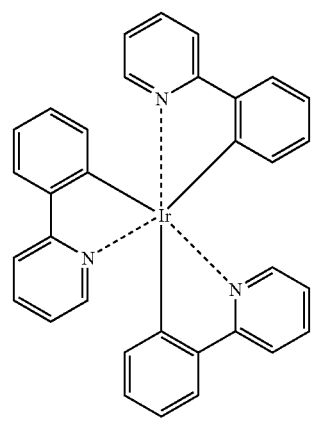

Ir-1

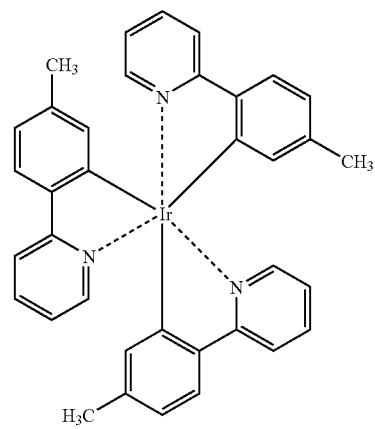

Ir-2

Ir-3
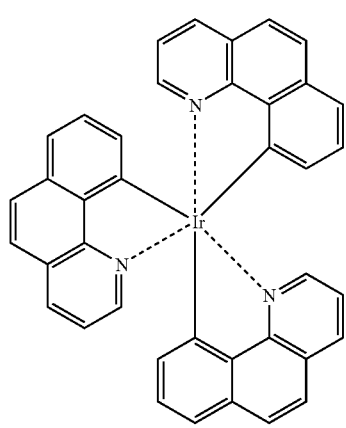
Ir-4
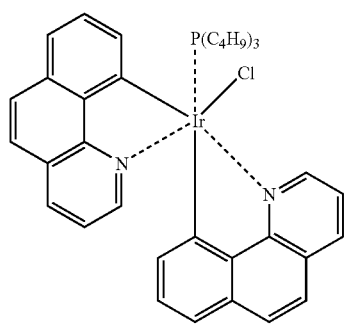
Ir-5
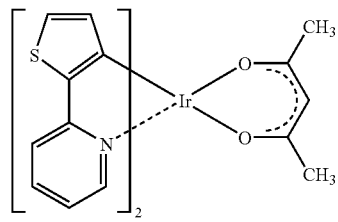
Ir-6
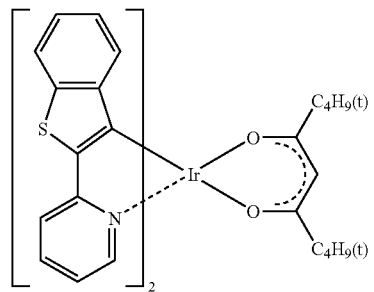
Ir-7
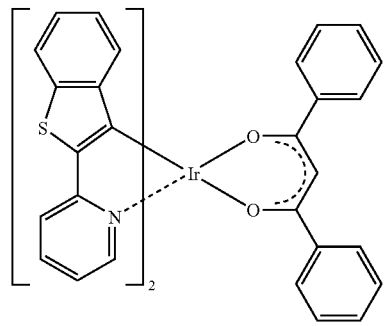
Ir-8
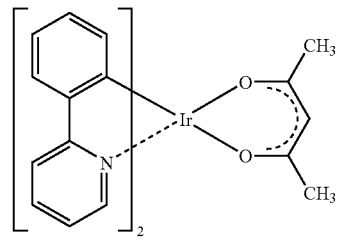
Ir-9
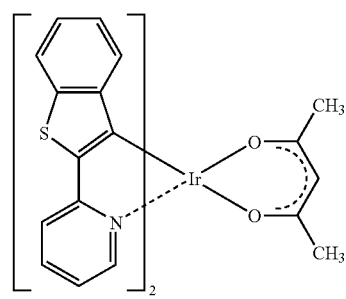
Ir-10
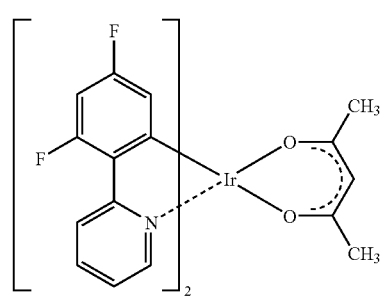
Ir-11
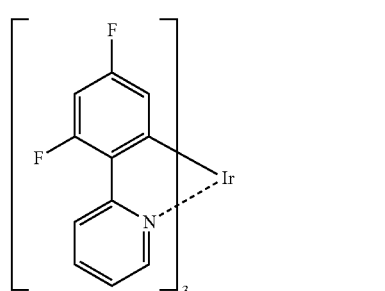
Ir-12
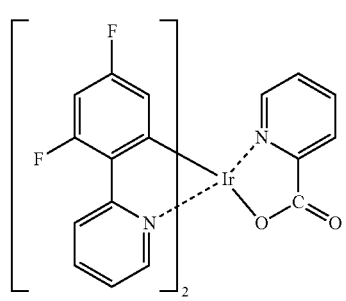

Ir-13
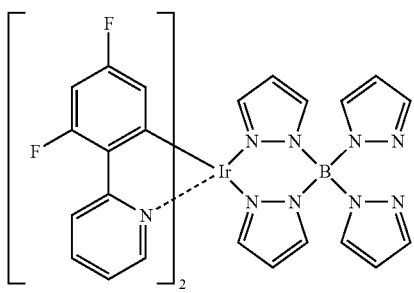
Ir-14
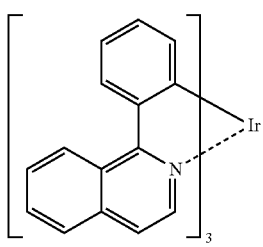
Pt-1
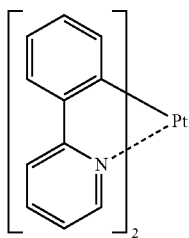
Pt-2
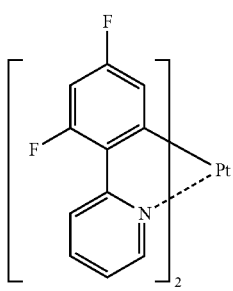
Pt-3
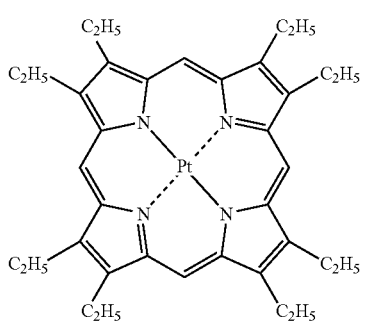
Os-1
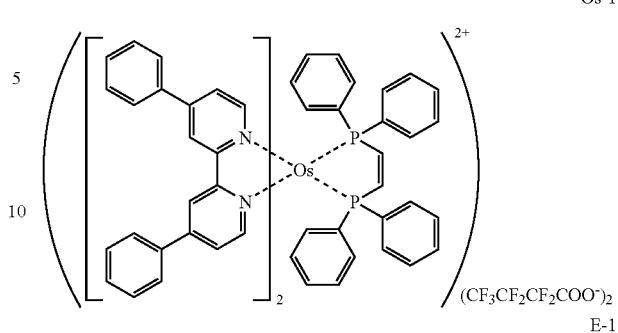
E-1
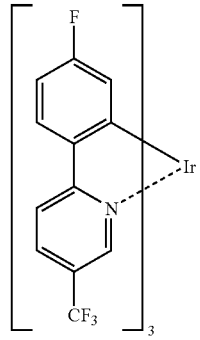
E-2
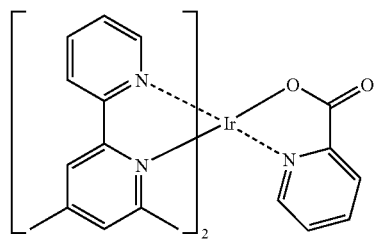
E-3
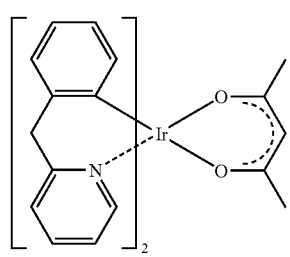
E-4
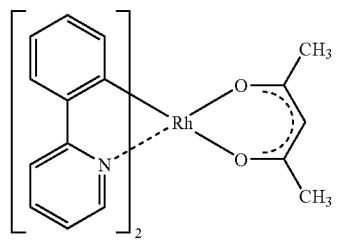
E-5
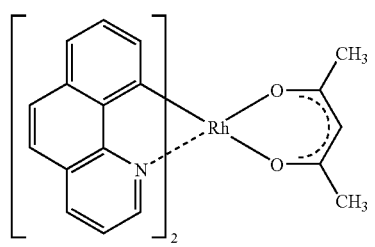

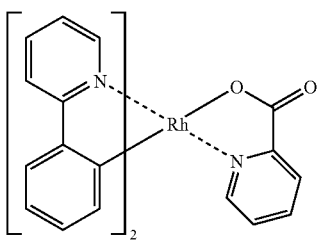 E-6

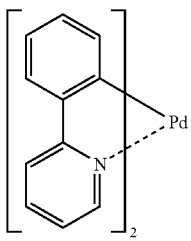 Pd-1

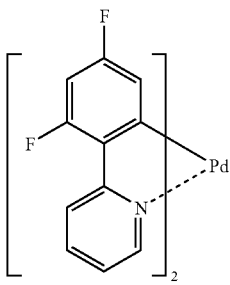 Pd-2

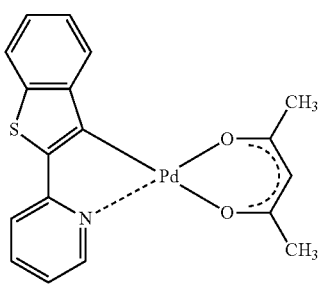 Pd-3

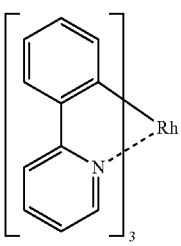 Rh-1

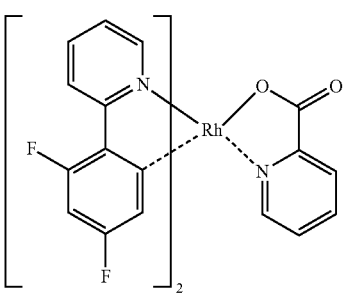 Rh-2

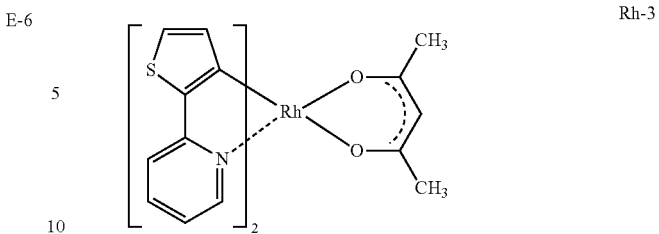 Rh-3

A typical example of a fluorescent light emission material (a fluorescent dopant) includes coumarin type dye, pyran type dye, cyanine type dye, croconium type dye, squarylium type dye, oxobenzanthracene type dye, fluorescein type dye, rhodamine type dye, pyrilium type dye, perylene type dye, stilbene type dye, polythiophene type dye or rare earth complex type fluorescent substances.

Known dopants may also be employed, examples thereof are listed;

WO 00/70655, JP-A 2002-280178, JP-A 2001-181616, JP-A 2002-280179, JP-A 2001-181617, JP-A 2002-280180, JP-A 2001-247859, JP-A 2002-299060, JP-A 2001-313178, JP-A 2002-302671, JP-A 2001-345183, JP-A 2002-324679, WO 02/15645, JP-A 2002-332291, JP-A 2002-50484, JP-A 2002-332292, JP-A 2002-83684, JP-A 2002-540572, JP-A 2002-117978, JP-A 2002-338588, JP-A 2002-170684, JP-A 2002-352960, WO 01/93642, JP-A 2002-50483, JP-A 2002-100476, JP-A 2002-173674, JP-A 2002-359082, JP-A 2002-175884, JP-A 2002-363552, JP-A 2002-184582, JP-A 2003-7469, JP-A 2002-525808, JP-A 2003-7471, JP-A 2002-525833, JP-A 2003-31366, JP-A 2002-226495, JP-A 2002-234894, JP-A 2002-235076, JP-A 2002-241751, JP-A 2001-319779, JP-A 2001-319780, JP-A 2002-62824, JP-A 2002-100474, JP-A 2002-203679, JP-A 2002-343572, JP-A 2002-203678 and so on.

The non-light emission intermediate layer (also referred to as non-doped region) to be used in the invention is described bellow.

The non-light emission intermediate layer is a layer provided between the light emission layers when the organic EL element has plural light emission layers.

The thickness of the non-light emission intermediate layer is preferably within the range of from 1 to 20 nm, and that being within the range of from 3 to 10 nm is particularly preferable by the reason of that the having such the thickness inhibits the interaction between the adjacent light emission layer such as energy transfer and does not give excessive load on the current-voltage property of the element.

The material to be used in the non-light emission intermediate layer may be the same as or different from the host compound of the light emission layer, and preferably the same as the host compound contained in at least one of the adjacent light emission layers.

The non-light emission intermediate layer may contain a compound such as the host compound in common with the each of the light emission layers, and the injection barrier between the light emission layer and the non-light emission layer is lowered, and the injection of the positive holes and electrons can be easily balanced even when the voltage (or current) is varied by that the commonly presence of the compound in these layers. Here, the common host material means the host materials in the layers are the same in the physico-chemical property such as glass transition point or in the molecular structure. Furthermore, the complication of the production process which is a large problem on the production of the organic EL element can be also solved by using the host material in the non-doped light emission layer, which is the same as that used in each of the light emission layers in the physicochemical property or the molecular structure.

Exited triplet energy of blue phosphorescent emission material becomes largest when phosphorescent emission materials are used in each of the light emission material in an organic EL element having each light emission layer of blue, green and red. A host material having larger excited triplet energy than the blue phosphorescent material mentioned above may be incorporated as common host material in the light emission layer and non-light emission intermediate layer.

In the organic EL device of this invention, the host material takes charge of transfer of the carrier; therefore, the host material preferably has carrier transferring ability. As a property for expressing the carrier transferring ability, carrier mobility is usually utilized and the carrier mobility is generally depended on the electric field strength. Material having low dependency on the electric field strength of the carrier mobility is preferably used for the material of the intermediate layer and the host material because the balance of the injection and transfer of the positive holes and the electrons tens to be lost in the material having high electric field strength dependency material.

On the other hand, it can be cites as a preferable embodiment that the non-light emission intermediate layer functions as the later-mentioned blocking layer, namely a positive hole blocking layer or an electron blocking layer, for suitably controlling the injection balance of the positives hole and electrons.

<<Injection Layer: Electron Injection Layer, Positive Hole Injection Layer>>

An injection layer is provided when it is necessary and includes an electron injection layer and a positive hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an driving voltage and to improve an emission luminance, which is detailed in volume 2, chapter 2 (pp. 123-166) of "Organic EL Elements and Industrialization Front thereof (Nov. 30, 1998, published by N. T. S. Inc.)", and includes a positive hole injection layer (an anode buffer layer) and an electron injection layer (a cathode buffer layer).

An anode buffer layer (a positive hole injection layer) is also detailed in such as JP-A H09-45479, JP-A H09-20062 and JP-A H08-288069, and specific examples include such as a phthalocyanine buffer layer represented by such as copper phthalocyanine, an oxide buffer layer represented by such as vanadium oxide, an amorphous carbon buffer layer, and a polymer buffer layer employing conductive polymer such as polyaniline (emeraldine) and polythiophene.

A cathode buffer layer (an electron injection layer) is also detailed in such as JP-A H06-325871, JP-A H09-17574 and JP-A H10-74586, and specific examples include a metal buffer layer represented by strontium, aluminum and so on, an alkali metal compound buffer layer represented by lithium fluoride, an alkali metal earth compound buffer layer represented by magnesium fluoride and an oxide buffer layer represented by aluminum oxide. The above-described buffer layer (injection layer) is preferably a very thin layer, and the layer thickness is preferably in a range of 0.1 nm-5 μm although it depends on a raw material.

<Inhibition Layer: Positive Hole Inhibition Layer, Electron Inhibition Layer>

An inhibition layer is provided in addition to an elemental layer arrangement of the organic compound layer as described above. There is, for example, a positive inhibition (hole block) layer described in such as JP-A H11-204258 and JP-A H11-204359 and p. 273 of "Organic EL Elements and Industrialization Front Thereof (Nov. 30 (1998), published by NTS. Inc.)".

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron. Further, an arrangement of an electron transport layer described later can be appropriately utilized as a positive hole inhibition layer according to this invention.

The positive hole inhibition layer of the organic EL device of this invention is preferably provided adjacent to an emission layer.

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, an arrangement of a positive hole transport layer described later can be appropriately utilized as an electron inhibition layer. Thickness of the positive hole inhibition layer and electron transport layer is preferably 3-100 nm, and more preferably 5-30 nm.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic material or an inorganic material. For example, listed are a triazole derivative, an oxadiazole derivative, an imidazole derivative, a polyarylalkane derivative, a pyrazoline derivative, a pyrazolone derivative, a phenylenediamine derivative, a arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive high molecular oligomer, specifically preferably such as thiophene oligomer.

As a positive hole transport material, those described above can be utilized, however, it is preferable to utilize a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)

phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; and N,N'-phenylcarbazole, in addition thereto, those having two condensed aromatic rings in a molecule described in U.S. Pat. No. 5,061,569, such as 4,4'-bis[N-(1-naphthyl)-N-phenylamino]biphenyl (NPD), and 4,4',4"-tris[N-(3-methylphenyl)-N-phenylamino]triphenylamine (MTDATA), in which three of triphenylamine units are bonded in a star burst form, described in JP-A H04-308688.

A polymer in which the material mentioned above is introduced in the polymer chain or a polymer having the material as the polymer main chain can be also used. As the hole injecting material or the hole transporting material, inorganic compounds such as p-type Si and p-type SiC are usable.

A so-called p-type hole blocking layer as disclosed in JP-A No. 11-251067 or described in the literature of J. Huang et al. (Applied Physics Letters 80 (2002), p. 139) is also applicable. In the present invention, these materials are preferably utilized since an emitting element exhibiting a higher efficiency is obtained.

This positive hole transport layer can be provided by forming a thin layer made of the above-described positive hole transport material according to a method known in the art such as a vacuum evaporation method, a spin coating method, a cast method, an inkjet method and a LB method. The layer thickness of a positive hole transport layer is not specifically limited, however, is generally 5 nm-5 µm, and preferably 5-200 nm. This positive transport layer may have a single layer structure comprised of one or two or more types of the above described materials.

A positive hole transport layer having high p-type property doped with impurity can be utilized. Example thereof includes those described in JP-A-H04-297076, JP-A-2000-196140, JP-A-2001-102175, and J. Appl. Phys., 95, 5773 (2004) and so on.

It is preferable to employ such a positive hole transport layer having high p-type property, since an element with lower power consumption can be prepared in this invention.

<Electron Transport Layer>

An electron transport layer is composed of a material having a function of transporting an electron, and in a broad meaning, an electron transport layer and a positive hole inhibition layer are also included in a positive hole transport layer. A single layer of or plural layers of an electron transport layer may be provided.

The electron transfer material (it works as a positive hole inhibition layer, simultaneously), which is employed in a single electron transfer layer and an electron transfer layer provided adjacent to cathode side with respect to emission layer when it is used as plural layers, is sufficient to have a function to transmit an electron injected from a cathode to an emission layer, and compounds conventionally known in the art can be utilized by arbitrarily selection as a material thereof. Any one can be employed by selecting from conventionally known compounds as its material. Examples of a material include such as a nitro-substituted fluorene derivative, a diphenylquinone derivative, a thiopyrandioxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative, a carboline derivative, or derivative having a carboline ring structure at least one of carbon atom of hydrocarbon ring of which is substituted by nitrogen. atom. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol) aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material.

This electron transport layer can be provided by forming a thin layer made of the above-described electron transport material according to a method known in the art such as a vacuum evaporation method, a spin coating method, a cast method, an inkjet method and a LB method. The layer thickness of an electron transport layer is not specifically limited; however, is generally 5 nm-5 µm, preferably 5-200 nm. This electron transport layer may have a single layer structure comprised of one or not less than two types of the above described materials.

An electron transport layer having high p-type property doped with impurity can be utilized. Example thereof includes those described in JP-A-H04-297076, JP-A-H10-270172, JP-A-2000-196140, JP-A-2001-102175, and J. Appl. Phys., 95, 5773 (2004) and so on.

It is preferable to employ such an electron transport layer having high p-type property, since an element with lower power consumption can be prepared in this invention.

<Substrate>

A substrate (also referred to as Base Body, Base Plate, Base Material or Support) according to an organic EL device of this invention is not specifically limited with respect to types of such as glass and plastics being transparent or opaque.

An example of an opaque substrate includes a metal plate such as aluminum and stainless steel, or film, an opaque resin substrate a substrate composed of ceramics.

It is preferred the substrate is transparent when the light is took out from the substrate side. A transparent substrate preferably used includes glass, quartz, and a transparent resin film. A specifically preferable substrate is resin film capable of providing an organic EL device with a flexible property.

Flexible film includes polyester such as polyethylene terephthalate (PET) and polyethylene naphthalate (PEN), polyethylene, polypropylene, cellophane, cellulose ester and its derivatives such as cellulose diacetate, cellulose triacetate, cellulose acetate butylate, cellulose acetate propionate (CAP), cellulose acetate phthalate, and cellulose nitrate, polyvinylidene chloride, polyvinylalcohol, polyethylenevinylalcohol, syndiotactic polystyrene, polycarbonate, norhornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or acrylates, cyclo-olefin resin such as ARTON (commercial name, manufactured by JSR Corp.) or APEL (commercial name, manufactured by Mitsui Chemicals Inc.). On the surface of resin film, an inorganic or organic cover layer or a hybrid cover layer comprising the both may be formed, and the film is preferably provided with a high barrier ability having a water vapor permeability of not more than 0.01 $g/m^2 \cdot 24$ h measured by a method stipulated by JIS K 7129-1992, and more preferably a high barrier ability having an oxygen permeability of not more than $10^{-1}$ $ml/m^2 \cdot 24$ h MPa as well as a water vapor permeability of not more than $10^{-3}$ $g/m^2 \cdot 24$ h, measured by a method stipulated by JIS K 7126-1992, and further preferably the water vapor permeability of not more than $10^{-3}$ $g/m^2 \cdot 24$ h and oxygen permeability of not more than $10^{-5}$ $ml/m^2 \cdot 24$ h·MPa, and moreover, the lower limit of the water vapor permeability and oxygen permeability is 0 $g/m^2 \cdot 24$ h and 0 $ml/m^2 \cdot 24$ h·MPa, respectively.

The material for forming the barrier layer includes those having a function to prevent the immersion of vapor, oxygen and so on which deteriorates the element, and includes for example an inorganic layer and a metal foil. The inorganic compounds such as those described in Thin-layer Handbook, pp. 879-901, Japan Society for the Promotion of Science, Vacuum Technology Handbook, pp. 502-509, 612 and 810, The Nikkan Kogyo Shinbun Ltd., and Vacuum Handbook revised edition, pp. 132-134, ULVAC Inc., are cited and metal such as In, Sn, Pb, Au, Cu, Ag, Al Ti Ni and so on, MgO, SiO, $SiO_2$, $Al_2O_3$, GeO, NiO, CaO, BaO, $Fe_2O_3$, $Y_2O_3$, $TiO_2$, $Cr_2O_3$, $Si_xO_y$, (x=1, y=15 to 2.0), $Ta_2O_3$, ZrN, SiC, TiC, PSG, $Si_3N_4$, SiN and SiON, single crystal Si, amorphous Si, and W are usable.

It is more preferable to give a laminated layer structure composed of such the inorganic layer and a layer of an organic material to the barrier layer for improving the fragility of the layer. It is preferable that the both kinds of layers are alternatively piled for several times though there is no limitation as to the laminating order of the inorganic layer and the organic layer.

<<Barrier Layer Forming Method>>

The method for forming the barrier layer is not specifically limited and, for example, a vacuum deposition method, spattering method, reaction spattering method, molecule beam epitaxy method, cluster-ion beam method, ion plating method, plasma polymerization method, atmosphere pressure plasma polymerization method, plasma. CVD method, laser CVD method, heat CVD method and coating method are applicable, and the atmosphere pressure plasma polymerization method such as that described in JP A 2004-68143 is particularly preferable.

Figure 2:
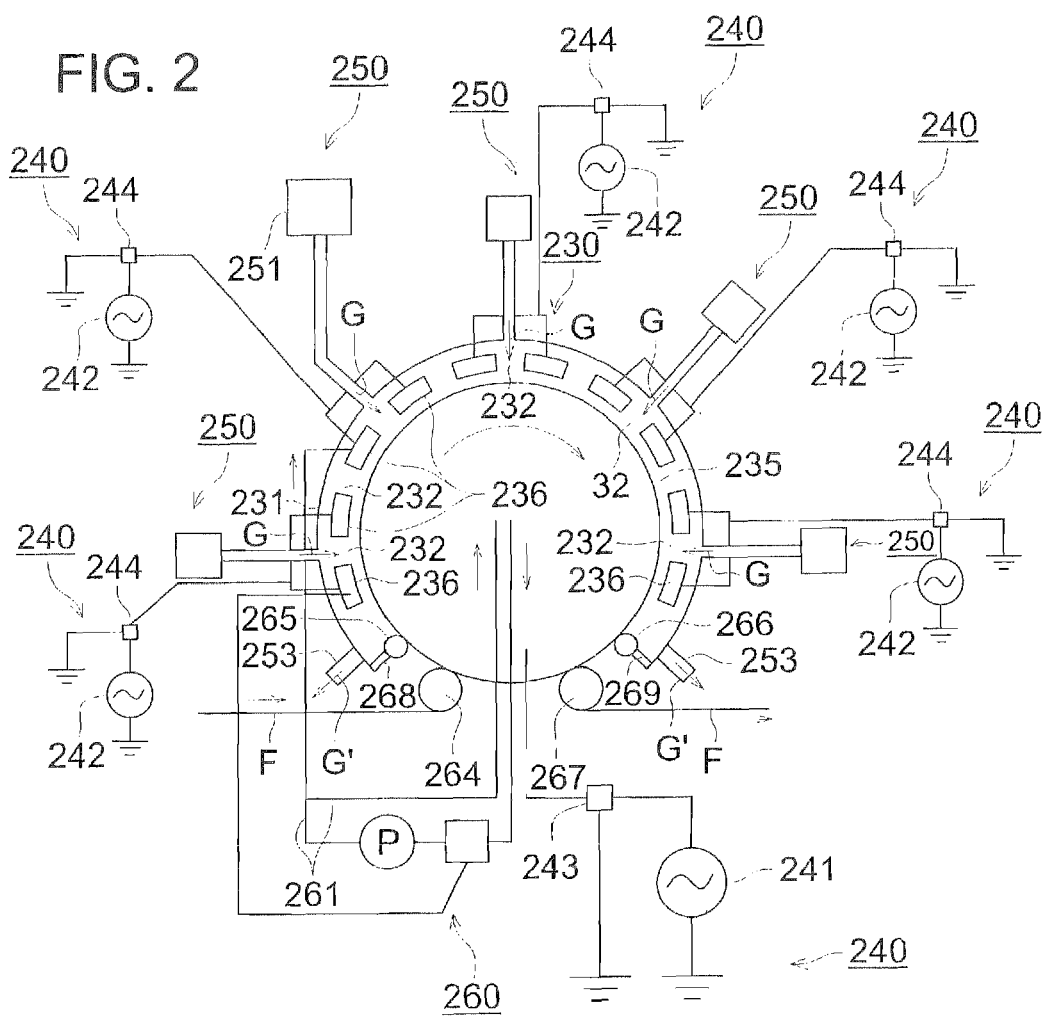
FIG. 2 shows a schematic drawing illustrating an example of atmospheric plasma discharge processing apparatus to treat a substrate.

An example of the layer structure of the barrier layer and that of an atmosphere plasma discharging treatment apparatus preferably used for forming the barrier layer are each described referring FIGS. 1 and 2, respectively.

FIG. 1 shows a schematic drawing of layer structure of the barrier layer, also referred to as gas barrier film, and an example of the density profile of the layer.

The barrier layer 201, which may be transparent or opaque, is formed by piling layer each different in the density on the substrate 202. In the invention, an intermediate density layer 204 is provided between a low density layer 203 and a high density layer 205 and an intermediate density layer 204 is further provided on the high density layer 205, and the structure constituted by the low density layer, intermediate layer, high density layer and the intermediate density layer forms a unit. In FIG. 1, an example in which two units of the above laminated layer are piled is shown. The density in each of the layers is uniform respectively, and the density is varied stepwise between the adjacent layers.

FIG. 2 is a schematic drawing of an example of an atmosphere pressure plasma discharging treatment apparatus for treating the substrate.

The atmosphere pressure discharging treatment apparatus has at least a plasma discharging treatment apparatus 230, an electric field applying means 240 having two power sources, a gas supplying means 250 and an electrode temperature controlling means 260.

FIG. 2 shows an apparatus in which a thin layer is formed on the substrate by treating the substrate with plasma discharge in a space between facing electrodes (discharging space) of a rotatable roller electrode (first electrode) 235 and a group of fixed columnar electrodes (second electrode) 236 (individual electrode is also referred to as 236). In FIG. 2, an electric field is formed by a pair of the columnar fixed electrode group (second electrode) 236 and the rotatable roller electrode (first electrode) 265, and the low density layer is formed in the electric field for example. FIG. 2 shows a constitution example having five of such the unit, by which laminated type barrier layer (also referred to as transparent gas barrier layer) can be continuously formed by independently controlling the kind of raw material to be supplied and the output voltage in each the units.

First high frequency electric field having a frequency $\omega_1$, electric field strength $V_1$ and electric current $I_1$ is applied to rotatable roller electrode (the first electrode) 235 from the first power source 241, and the second high frequency electric field having a frequency $\omega_2$, electric field strength $V_2$ and electric current $I_2$ is applied to the columnar fixed electrode (the second electrode) group 236 from the second power source 242 to form an high frequency electric field at the discharging space (between the facing electrodes) 232.

A first filter 243 is arranged between the rotatable roller electrode (the first electrode) 235 and the first power source 241, which is designed so that the electric current from the first power source 241 to the first electrode flows easily and the electric current from the second power source 242 difficultly flows by grounding.

Second filters 244 are each arranged between the columnar electrode (the first electrode) group 236 and the second power source 242, which is designed so that the electric current from the second power source 242 to the second electrode flows easily and the electric current from the first power source 241 difficultly flows by grounding.

It is also allowed that the rotatable roller electrode 235 is made as the second electrode and the columnar electrode group 236 is made as the first electrode. In any of the cases, the first power source is connected to the first electrode and the second power source is connected to the second electrode. The first power source preferably applies the high frequency electric field higher than that applied from the second power source ($V_1 > V_2$). The power sources have each an ability to apply the frequency in a relation of $\omega_1 < \omega_2$.

The electric currents preferably have a relation of $I_1 < I_2$. The current of the first high frequency electric field $I_1$ is preferably from 0.3 to 20 mA and more preferably from 1.0 to 20 mA. The current of the second high frequency electric field $I_2$ is preferably from 10 to 100 mA and more preferably from 20 to 100 mA.

Gas G generated from a gas generation device 251 of the gas supplying means 250 is introduced into the plasma discharging treatment chamber 231 through the gas supplying entrance while controlling the flowing amount.

The substrate F is transferred from a bulk roll, not shown in the drawing, by rewinding or from the previous process through a guide roller 264 and air accompanied with the substrate was eliminated by nip roller 265. The substrate is further transferred in the space between the fixed columnar electrode group while contacting with the rotatable roller electrode 235, and an electric field is applied from both of the rotatable roller electrode (the first electrode 235 and the fixed columnar electrode group (the second electrode) 236 to generate discharging plasma between the facing electrodes (the discharging space). A thin layer is formed on the substrate F by the gas in the plasma state while contacting with and transferring by the rotatable roller electrode 235. Then the substrate is winded up by a winder, not shown in the drawing, or transferred to next process through a nip roller 266 and a guide roller 267.

The exhaust gas after the discharging treatment is exhausted through a gas discharging opening 253.

During the thin layer formation, the temperature of the electrodes was controlled from the inside of the electrodes by a medium controlled in the temperature by a electrode temperature controlling means 260 and send by a pump P through a piping 261 for heating or cooling the electrode, 268 and 269 are parting plates for parting the plasma discharging treatment chamber 231 from the outside.

<<Sealing>>

The sealing means to be used in the invention is a method in which a sealing material such as a flexible film having the barrier layer is allowed to adhere to the substrate on which the organic El element is formed by an adhesive.

The flexible film having the barrier layer is arranged so as to cover the displaying area of the organic EL element.

As the adhesive, an acrylic acid type oligomer, a photo- and thermo-curable adhesive of a methacrylic acid oligomer having a reactive vinyl group and a moisture curable adhesive such as 2-cyanoacrylate can be concretely cited. A thermally or chemically curable (two liquid mixing type) such as an epoxy type adhesive is usable. Hot-melt type polyamide, polyester and polyolefin can also be cited. Further more, a cation curing type UV curable epoxy resin adhesive can be cited.

Besides, it has been known that organic compounds constituting the organic EL element is destroyed and degraded by UV irradiation. Consequently, irradiation amount of UV rays is reduced as small as possible by the combination use of the thermo-curable adhesive even when the UV curable adhesive is used.

However, the properties of the device are degraded by heating in some cases according to the properties of the organic compound and a problem is caused in suitably performance of the sealing treatment.

In the invention, the degradation by the heat treatment can be inhibited and the organic EL device superior in the properties can be obtained by making the content of the compound having a glass transition point of not less than 100° C. to 80% to 100%.

A desiccating agent may be dispersed in the adhesive. Coating of the adhesive on the sealing portion may be performed by using a dispenser available on the market or printing by screen printing.

In the invention, the adhesion layer is formed so as to cover the whole plane of the organic layer. The adhesion layer may be placed on any of the element side or sealing material side, and the placing on the sealing material side is preferable considering damage on the surface of EL element.

Figure 3:
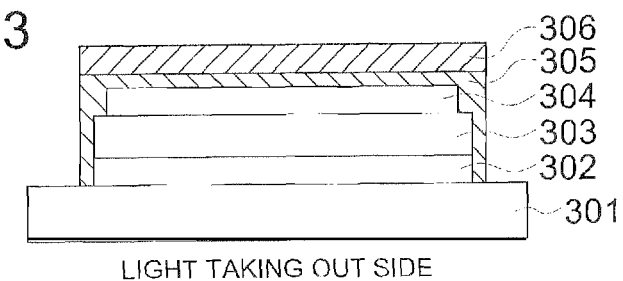
FIG. 3 shows an example of the embodiment of this invention.

An example of embodiment of the invention is shown in FIG. 3.

In the invention, the thickness of the second electrode (cathode) 304 contacting with the adhesion layer 305 is preferably not less than 200 nm.

In the invention, a layer 307 of an inorganic compound having an oxygen permeability of not more than 1 ml/m$^2$·24 h·MPa and a water vapor permeability of not more than $10^{-2}$ g/m$^2$·24 h is preferably formed between the adhering layer 305 and the organic layer 303 when the adhesion layer 305 is directly contacted with the organic layer. An example of such the embodiment is shown in FIG. 4.

Figure 5:
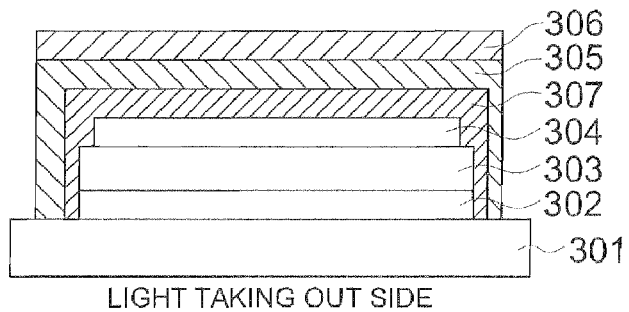
FIG. 5 shows another example of the embodiment of this invention.

When the second electrode (cathode) 304 is formed on the organic layer and the adhesion layer is further formed on such the layer, an inorganic compound layer 307 having an oxygen permeability of not more than 1 ml/m$^2$·24 h·MPa and a water vapor permeability of not more than $10^{-2}$ g/m$^2$·24 h is preferably provided between the second electrode (cathode) 304 and the adhesion layer 305. An example of such the embodiment is shown in FIG. 5.

The oxygen permeability and the water vapor permeability of the inorganic layer are each preferably not more than $10^{-1}$ ml/m$^2$·24 h·MPa and not more than $10^{-3}$ g/m$^2$·24 h, and more preferably not more than $10^{-3}$ ml/m$^2$·24 h·MPa and not more than $10^{-5}$ g/m$^2$·24 h, respectively.

As the material for forming the inorganic layer, inorganic compounds such as those described in Thin-layer Handbook, pp. 879-901, Japan Society for the Promotion of Science, Vacuum Technology Handbook, pp. 502-509, 612 and 810, The Nikkan Kogyo Shinbun Ltd., and Vacuum Handbook revised edition, pp. 132-134, ULVAC Inc., are cited and insulating materials such as MgO, SiO, SiO$_2$, Al$_2$O$_3$, GeO, NiO, CaO, BaO, Fe$_2$O$_3$, Y$_2$O$_3$, TiO$_2$, Cr$_2$O$_3$, Si$_x$O$_y$ (x=1, y=1.5 to 2.0), Ta$_2$O$_3$, ZrN, SiC, TiC, Si$_3$N$_4$, SiN and SiON are usable.

The method for forming the barrier layer of the inorganic compound is not specifically limited and a vacuum deposition method, spattering method, reaction spattering method, molecular ray epitaxial method, cluster-ion beam method, ion plating method, plasma polymerization method, atmosphere pressure plasma polymerization method, plasma CVD method, laser CVD method, thermal CVD method and coating method can be applied for example.

An organic compound layer may be formed on the inorganic compound layer and a method for forming a layer by alternatively forming a plurality of the inorganic compound layer and the inorganic compound layer is suitably utilized.

The pasting of the substrate with the sealing material is preferably carried out under a reduced pressure atmosphere from the viewpoint of elimination of bubbles and gas passages. As the pasting method, a flat panel press and a roller laminator can be applied.

The substrate and the sealing material are preferably is allowed to adhere so that the thickness of the adhesion layer becomes from 1 to 100 μm. Consequently, filler is preferably mixed with the adhesive. As the filler, beads or fiber of glass, quartz, epoxy resin, fluororesin, silicone resin and acryl resin are usable.

The resin film usable as the substrate also can be used as the flexible film having the barrier layer to be used for the sealing material.

The thickness of the flexible film may be approximately from 10 to 500 μm and preferably from 30 to 200 μm.

Metal foil and resin film coated with metal foil are also suitably usable. As the material of the metal foil, for example, a metal such as aluminum, copper and nickel and an alloy such as stainless steel and aluminum alloy are usable and aluminum is preferable from the viewpoint of easiness of processing and cost. The thickness is about 1 to 100 µm and desirably about 30 to 200 µm.

The layer is preferably a composite layer having a laminated structure composed of an inorganic layer and a layer composed of organic material for improving the fragility of the layer. It is preferable to alternatively pile the inorganic layers and the organic layers for plural times though the piling order of the inorganic layer and the organic layer is not specifically limited.

The water vapor permeability as the barrier property is preferably not more than 0.01 g/m$^2$·24 h considering crystallization of the organic layer, formation of dark spots caused by peeling of the second electrode and lifetime prolongation of the organic EL element. The water vapor permeability is a value measured by MOCON method according to JIS K7129B (1987).

The oxygen permeability as the barrier property is preferably not more than 0.1 ml/m$^2$·24 h·MPa considering crystallization of the organic layer, formation of dark spots caused by peeling of the second electrode and lifetime prolongation of the organic EL element. Particularly, film having high barrier properties such as an oxygen permeability of not more than 102 ml/m$^2$·24 h·MPa and a water vapor permeability of not more than $10^{-5}$ g/m$^2$·24 h is preferred <<Protection Layer and Protection Plate>>

For raising the mechanical strength of the element, a protection layer or a protection plate may be provided on outside of the sealing layer of the side facing to the substrate through the organic layer or the outside of the sealing film. The glass plate, polymer plate, polymer film and plate, and metal film and plate the same as those to be used for sealing are usable for such the protection material. Polymer film is preferably used <Anode>

As an anode according to an organic EL element, those comprising metal, alloy, a conductive compound, which has a large work function (not less than 4 eV), and a mixture thereof as an electrode substance are preferably utilized. Specific examples of such an electrode substance include a conductive transparent material such as metal like Au, CuI, indium tin oxide (ITO), SnO$_2$ and ZnO. Further, a material such as IDIXO (In$_2$O$_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 µm), a pattern may be formed through a mask of a desired form at the time of evaporation or spattering of the above-described substance. When emission is taken out of this anode, the transmittance is preferably set to not less than 10% and the sheet resistance as an anode is preferably not more than a several hundreds Ω/□. Further, although the layer thickness depends on a material, it is generally selected in a range of 10-1,000 nm and preferably of 10-200 nm.

<Cathode>

On the other hand, as a cathode according to this invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al$_2$O$_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide (Al$_2$O$_3$) mixture and a lithium/aluminum mixture, and aluminum. A cathode can be provided by a method such as evaporation or spattering to form a thin layer. Further, the sheet resistance as a cathode is preferably not more than a several hundreds Ω/□ and the layer thickness is generally selected in a range of 10-5 µm and preferably of 50-200 nm. Herein, to transmit emission, either one of an anode or a cathode of an organic EL element is preferably transparent or translucent to improve the mission luminance.

A transparent or translucent cathode may be prepared by a method in which the above mentioned metal is provided on the anode with a thickness of 1-20 nm and then electroconductive transparent material described as the anode. An element having both transparent anode and cathode may be prepared by applying this method.

<Preparation Method of Organic EL Device>

As an example of a preparation method of an organic EL device of this invention, a preparation method of an organic EL element, comprising anode/positive hole injection layer/positive hole transport layer/emission layer/positive hole inhibition layer/electron transport layer/cathode, will be described.

First, on an appropriate substrate, a thin layer comprising a desired electrode substance such as an anode electrode substance is formed by means of evaporation or spattering so as to make a layer thickness of not more than 1 µm and preferably of 10-200 nm, whereby an anode is prepared. Next, thin layers containing organic substances of the material for the organic EL element such as a positive hole injection layer, a positive hole transport layer, an emission layer, a positive hole inhibition layer and an electron transport layer are formed on this layer.

A thin layer forming method of the thin organic substance layer includes such as an evaporation method and a wet process (a spin coat method, a cast method, an inkjet method, and a printing method) as described before, however, a vacuum evaporation method, a spin coat method, inkjet method, or a printing method is specifically preferable with respect to easy preparation of a homogeneous layer and bare generation of pinholes. Further, a different layer forming method depending on each layer may be applied. In the case of employing an evaporation method in layer formation, the evaporation condition depends on such as the type of a utilized compound, however, is generally appropriately selected in a range of 50 to 450° C. as a boat heating temperature, $10^{-6}$ to $10^{-2}$ Pa as a vacuum degree, 0.01 to 50 nm/sec as a deposition rate, −50 to 300° C. as a substrate temperature and 1 nm to 5 µm, preferably 5 to 200 nm as a layer thickness. After formation of these layers, a thin layer comprising a cathode electrode substance is formed thereon by means of such as evaporation or spattering so as to make a layer thickness in a range of 50 to 200 nm to provide a cathode, whereby a desired organic EL element can be prepared. This preparation of an organic EL element is preferably carried out with one time evacuation to prepare all through from a positive hole injection layer to a cathode, however, different layer forming method may be also applied by taking out the element on the way. At that time, consideration is necessary such that the operation be performed under a dry inert gas environment.

Further, reversing the preparation order, it is also possible to prepare layers in the order of a cathode, an electron transport layer, a positive hole inhibition layer, an emission layer, a positive hole transport layer and an anode. When a direct current voltage is applied on the multicolor display device thus prepared, emission can be observed by application of a voltage of approximately 2-40 V setting an anode to + (plus) polarity and a cathode to − (minus) polarity. Further, alternate current can be applied. Herein, the wave shape of alternate current may be arbitrary.

Generally it is said that, in the organic EL element of this invention, light is emitted in a layer of which refractive index is higher (the refractive index is about 1.6 to 2.1) than that of air, and only 15 to 20% of the light emitted in the light emission layer can be taken out. This is because the light which enters into the interface (interface of a transparent substrate and air) with the angle θ larger than a critical angle cannot be taken out of the element due to the total internal reflection, or because the light is totally reflected between the transparent substrate and the transparent electrode or between the transparent substrate and the light emission layer, resulting in being wave-guided in the transparent electrode or in the light emission layer to get away to the side of the element.

Examples of a method to improve the efficiency of taking out of the light include: a method to form concavity and convexity on the surface of the transparent substrate to prevent total internal reflection at the interface between the transparent substrate and air (for example, refer to U.S. Pat. No. 4,774,435); a method to provide a light converging function to the substrate (for example, refer to JP-A S63-314795); a method to provide a reflecting surface on the side of the element (for example, refer to JP-A No. 1-220394); a method to provide a flat layer between the substrate and the light emission layer, the flat layer having an intermediate refractive index to form an anti-reflection layer (for example, refer to JP-A S62-172691); a method to provide a flat layer having a low refractive index between the substrate and the light emission layer (for example, JP-A 2001-202827); and a method to provide a diffraction grating between any of the substrate, transparent electrode and light emission layer (including the interlayer between the substrate and out side air) (for example refer to JP-A H11-283751).

These methods can be used in combination with the organic electroluminescence element of the present invention. Also, a method of forming a flat layer having a lower refractive index than that of the substrate between the substrate and the light emission layer, or a method of forming a diffraction grating between any of the substrate, transparent electrode and light emission layer (including the interlayer between the substrate and out side air) can be preferably used.

An element exhibiting further higher luminance and durability can be obtained by combining these methods, in the present invention.

The light-extracting efficiency of light which comes out of the transparent electrode increases with decreasing refractive index when a low refractive index medium having a thickness larger than the wavelength of the light is formed between the transparent electrode and the transparent substrate.

As a low refractive index layer, aerogel, porous silica, magnesium fluoride and fluorine-containing polymer, are cited, for example. Since the refractive index of the transparent substrate is generally 1.5 to 1.7, the refractive index of the low refractive index layer is preferably 1.5 or less and more preferably 1.35 or less.

The thickness of a low refractive index medium is preferably more than twice of the wavelength of the light in the medium, because when the thickness of the low refractive index medium, where the electromagnetic wave exuded as an evanescent wave enters into the transparent substrate, and the effect of the low refractive index layer is reduced.

The method to provide a diffraction grating at the interface where the total internal reflection occurs or in some of the medium has a feature that the effect of enhancing the light-extracting efficiency is high. The intension of this method is to take out the light which cannot come out due to such as total internal reflection between the layers among the light emitted in the light emission layer, by providing a diffraction grating between any of the layers or in any of the mediums (in the transparent substrate or in the transparent electrode), using the property of the diffraction grating that it can change the direction of light to a specified direction different from the direction of reflection due to so-called Bragg diffraction such as primary diffraction or secondary diffraction.

The diffraction grating to be introduced preferably has a two-dimensional periodic refractive index. This is because, since the light is emitted randomly to any direction, only the light proceeds to a specific direction can be diffracted when a generally used one-dimensional diffraction grating having a periodic refractive index only in a specific direction is used, whereby the light-extracting efficiency is not largely increases.

However, by using diffraction grating having a two-dimensionally periodic refractive index, the light proceeds any direction can be diffracted, whereby the light-extracting efficiency is increased.

The diffraction grating may be provided between any of the layers on in any of the mediums (in the transparent substrate or in the transparent electrode), however, it is preferably provided in the vicinity of the organic light emission layer where the light is emitted.

The period of the diffraction grating is preferably ½ to 3 times of the wavelength of the light in the medium. The array of the diffraction grating is preferably two-dimensionally repeated, for example, as in the shape of a square lattice, a triangular lattice, or a honeycomb lattice.

The luminance in the specified direction, for example, the front direction against the emitting surface of the element can be increased, for example, by processing to form a structure of a micro-lens array or in combination with a so-called light-condensing sheet on the light-extracting side surface of the substrate in the organic electroluminescence element of the present invention.

As an example of a micro-lens array, quadrangular pyramids 30 μm on a side and having a vertex angle of 90° are two-dimensionally arranged on the light extracting side surface of the substrate. The side of the quadrangular pyramids is preferably 10-100 μm. When the length of the side is shorter than the above range, the light is colored due to the effect of diffraction, and when it is longer than the above range, it becomes unfavorably thick.

As a light-condensing sheet, the one practically applied for an LED backlight of a liquid crystal display is applicable. Examples of such a sheet include a brightness enhancing film (BEF) produced by SUMITOMO 3M Inc. As the shape of the prism, triangle-shaped strip having a vertex angle of 90° and a pitch of 50 μm, the one having round apexes, or the one having a randomly changed pitch may be included.

In order to control the luminous radiation angle of the light emitting element, a light diffusion plate and a film may be used in combination with the light-condensing sheet. For example, a diffusion film (light-up) produced by KIMOTO Co., Ltd. can be used.

<<Use>>

The organic EL device of the invention can be used as a displaying device, display, and various kinds of light source. As the light source, domestic illumination, car interior illumination, backlight of watches or liquid crystal displays, sign boards, signals, light source of photo memories, light source of electrophotographic copying machine, light source of light communication processor and light source of light sensors though the use is not limited to the above. Particularly, the device is suitably used in combination with a color filter as the backlight of the liquid crystal display or the light source of illumination.

The device is preferably used in combination with a light collection sheet for further raising illuminance when the device combined with a color filter is used as the backlight of the display.

EXAMPLES

The invention is described below referring examples, though the invention is not limited to the examples.

Example 1

Preparation of Organic EL Device 1

For preparing an anode, an electrode was patterned on a glass substrate having a size of 30 mm×30 mm and a thickness of 0.7 mm and an ITO (indium tin oxide) layer of 120 nm formed thereon and the transparent substrate having the ITO transparent electrode was washed by isopropyl alcohol while applying ultrasonic wave, dried by desiccated nitrogen gas and subjected to UV-ozone washing. Then the transparent substrate was fixed on the substrate holder of a vacuum deposition apparatus available on the market.

Suitable amount of constitution materials of each of the layers were separately charged in each of crucibles, respectively. The crucibles made from a heat resistive material prepared by molybdenum or tungsten was used.

Then the pressure in the vacuum deposition apparatus was reduced by a vacuum degree of $4 \times 10^{-4}$ Pa and the crucible containing m-MTDATA (Tg: 75° C.) was heated by applying electric current for depositing m-MTDATA onto the transparent substrate at a deposition rate of 0.1 nm/sec to form a positive hole injection layer of 10 nm. Next, Compound A-1 (Tg: 140° C.) was deposited in the similar manner to form a positive hole transfer layer of 40 nm. After that, each of the light emission layers and intermediate layer were formed by the following procedure.

Compound A-2 (Tg: 102° C.) and Compound A-3 were co-deposited at a deposition rate of 0.1 nm/sec so as to make the thickness ratio of 95:5 to form a blue phosphorescent light emission layer of 12 nm and then Compound A-4 (Tg: 87° C.) was deposited at a deposition rate of 0.1 nm/sec to form a positive hole blocking layer of 3 nm adjacent on the cathode side of the blue light emission layer.

Compound A-2 and Compound Ir-14 were co-deposited at a deposition rate of 0.1 nm/sec so as to make the thickness ratio of 92:8 to form a red phosphorescent light emission layer of 10 nm and then Compound A-2 was deposited at a deposition rate of 0.1 nm/sec to form a layer of 3 nm.

Compound A-2 and Compound Ir-1 were co-deposited at a deposition rate of 0.1 nm/sec so as to make the thickness ratio of 96:4 to form a green phosphorescent light emission layer of 2.5 nm. After that, the crucible containing BAlq (Tg 99° C.) was heated by applying electric current and BAlq was deposited on the above layer at a deposition rate of 0.1 nm/sec to form a positive hole blocking layer of 5 nm, and then Compound A-5 (Tg 81° C.) was deposited by 25 nm at a deposition rate of 0.1 nm/sec and LiF was deposited by 0.5 nm at a deposition rate of 0.03 nm/sec so as to provide an electron transfer-injection layer.

An aluminum layer of 110 nm was further deposited to form the electrode.

Flexible film was allowed to adhere for sealing according to the following procedure.

Gas barrier film having a oxygen permeability of not more than 1 nl/m²·24 h·MPa and a water vapor permeability of not more than 0.01 g/m²·24 h was prepared by forming one or more gas barrier layers mainly constituted by inorganic layer of $SiO_2$ on a substrate of poly(ethylene terephthalate, hereinafter referred to as PET, of about 100 μm by the foregoing atmosphere pressure plasma treatment apparatus.

A thermally curable epoxy resin adhesive was coated on, the gas barrier layer of the flexible film by screen printing under atmosphere of highly purified nitrogen having a purity of 99.999% so that the adhesive covered the organic EL element including the circumference portion thereof except the surface of the light emission element and the portion for taking out the leads of the electrodes.

The organic EL element formed on the glass plate was positioned so as to face to the flexible film having the barrier layer on which the adhesive was coated and the environmental pressure was reduced by 10 Pa. After that, the resin film having the gas barrier ability was pasted by a planar press machine at a pressure of 0.05 MPa. Then the adhesive was cured at 95° C. for 5 hours to prepare Organic EL Device 1 was prepared.

The epoxy resin may be UV curable type. In such the case, UV rays were irradiated on the occasion of the pasting for curing. Heating treatment may be further added according to necessity, Preparation of Organic EL Device 2

On the substrate washed by the same manner as in that used in Organic EL Device 1, a positive hole injection layer of 10 nm was formed by vapor depositing Compound A-6 (Tg: 110° C.) at a deposition rate of 0.1 nm/sec under a vacuum degree of $4 \times 10^{-4}$ Pa by applying electric current to the crucible containing Compound A-6.

After that, a positive hole transfer layer of 40 nm was formed by vapor depositing Compound A-1 in the similar manner. And then each of light emission layers and intermediate layers were provided by the following procedures.

Compound A-2 (Tg: 102° C.) and Compound A-3 were co-deposited at a deposition rate of 0.1 nm/sec so as to make the thickness ratio of 95:5 to form a blue phosphorescent light emission layer of 12 nm and then Compound A-4 (Tg: 87° C.) was deposited at a deposition rate of 0.1 nm/sec to form a positive hole blocking layer of 3 nm adjacent on the cathode side of the blue light emission layer.

Compound A-2 and Compound Ir-14 were co-deposited at a deposition rate of 0.1 nm/sec so as to make the thickness ratio of 92:8 to form a red phosphorescent light emission layer of 10 nm and then Compound A-2 was deposited at a deposition rate of 0.1 nm/sec to form a layer of 3 nm.

Compound A-2 and Compound Ir-1 were co-deposited at a deposition rate of 0.1 nm/sec so as to make the thickness ratio of 96:4 to form a green phosphorescent light emission layer of 2.5 nm. After that, the crucible containing BAlq was heated by applying electric current and BAlq was deposited on the above layer at a deposition rate of 0.1 nm/sec to form a positive hole blocking layer of 5 nm, and then Compound A-7

(Tg 195° C.) was deposited by 25 nm at a deposition rate of 0.1 nm/sec and LiF was deposited by 0.5 nm at a deposition rate of 0.03 nm/sec so as to provide an electron transfer-injection layer.

An aluminum layer of 110 nm was further deposited to form the electrode. The device was sealed in the same manner as in Organic EL Device 1 to prepare Organic EL Device 2.

Preparation of Organic EL Device 3

The organic layers and the cathode were formed in the same manner as in Organic EL Device 2 and the device was sealed by the following procedures.

Non-light emission surface of the organic EL element was covered with a glass case having a depression of 0.3 mm and was allowed to adhere employing the foregoing thermo-curable epoxy resin. The resin was thermally cured at 95° C. for 5 hours to prepare Organic EL Device 3. A moisture absorbing seal having a thickness of about 0.2 mm was allowed to adhere in the depression. The sealing work was carried out in a globe box filled highly purified nitrogen gas having a purity of 99.999% or more so that the device was not contacted with air.

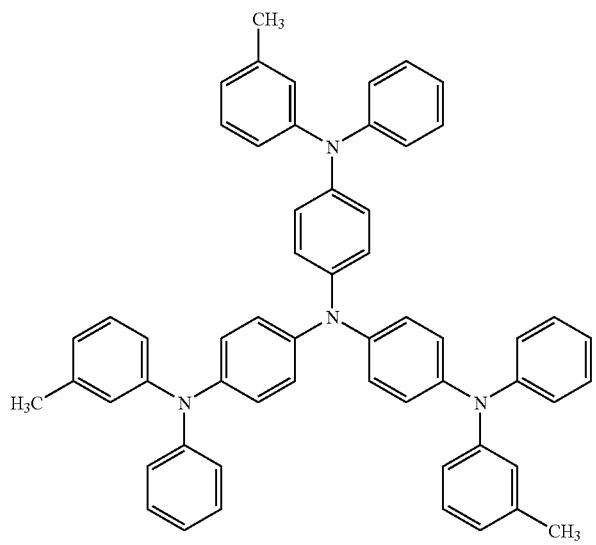

m-MTDATA

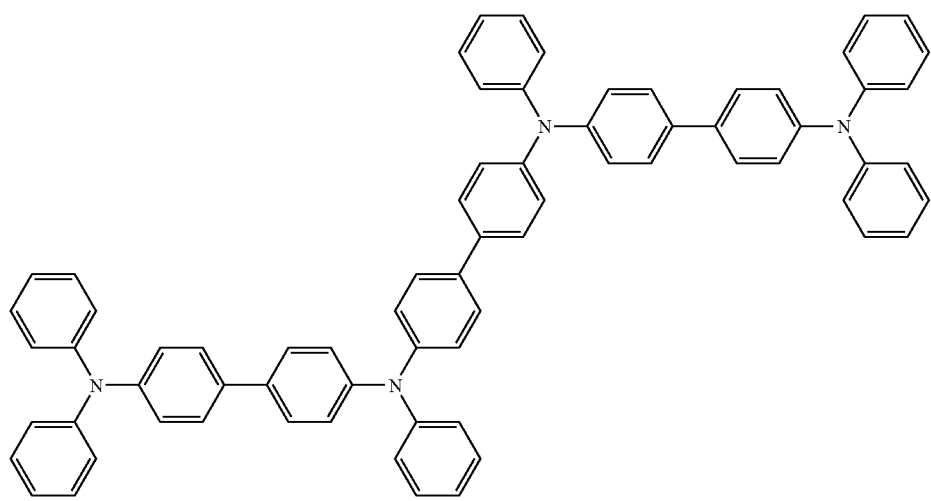

A-1

-continued
A-2
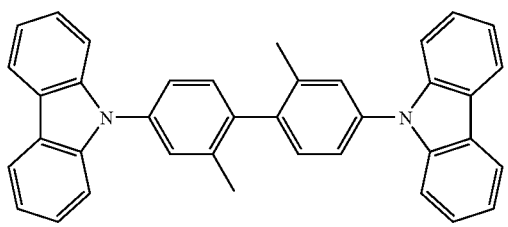
A-3
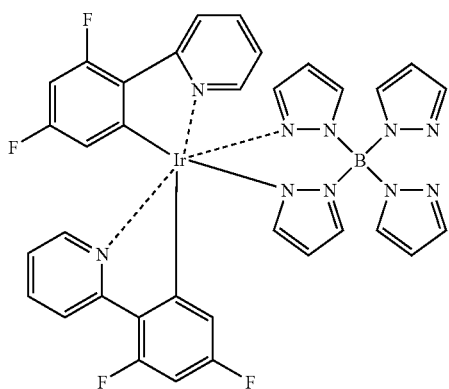
A-4
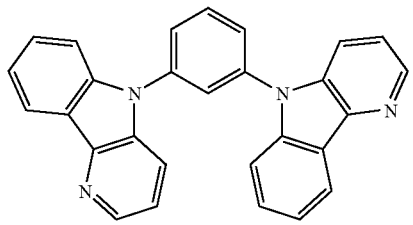
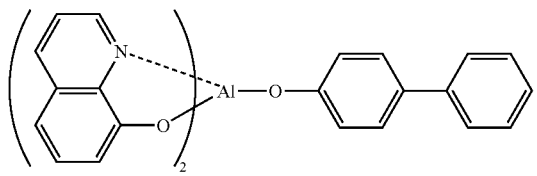
BAlq
A-5
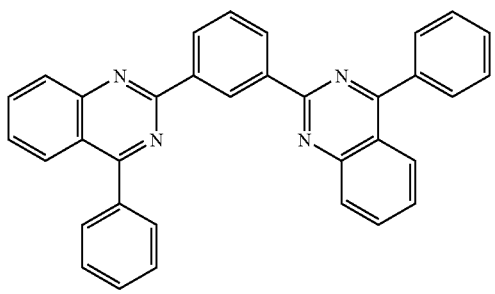
A-6
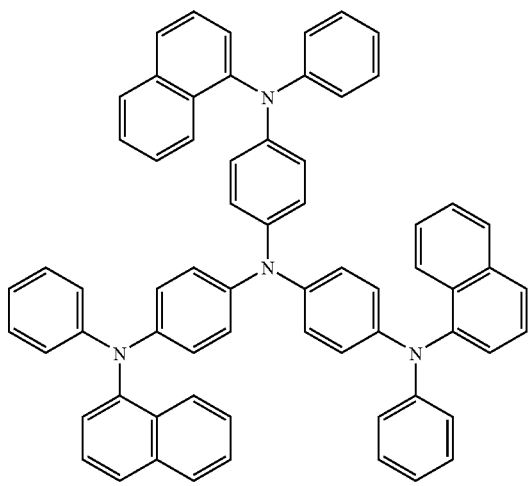
A-7
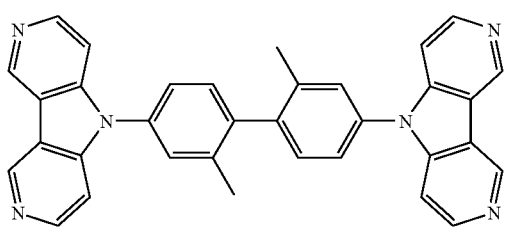

Evaluation of Light Emission Property of Organic EL Device

Figure 6:
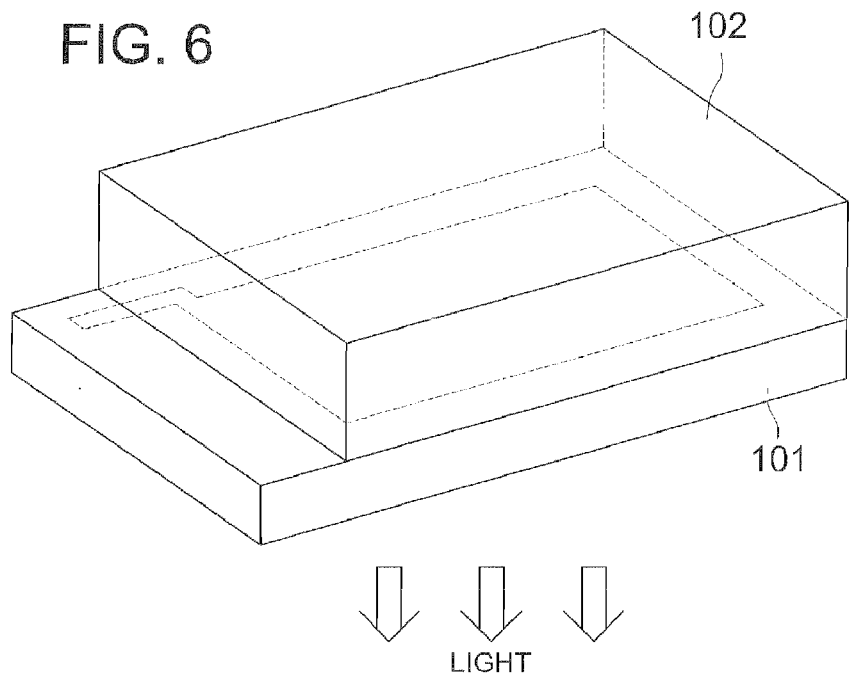
FIG. 6 shows a schematic drawing of the illuminating device.
Figure 7:
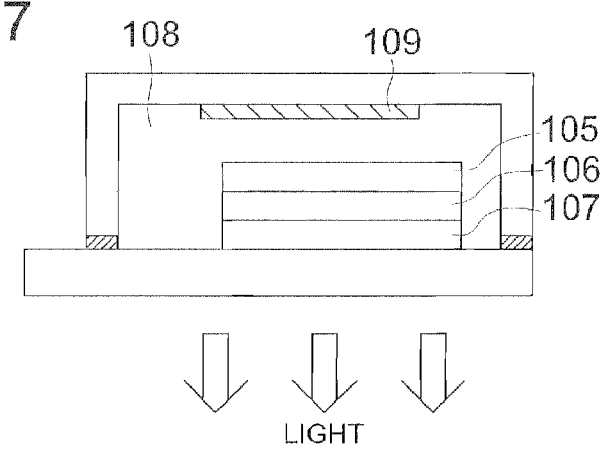
FIG. 7 shows a cross sectional view of the conventional illuminating device employing an organic EL element.

Illuminating devices of FIG. 6 using Organic EL Devices or 2 and that of FIG. 7 using Organic EL Device 3 were assembled and the light emission efficiency at a front illuminance of 1,000 cd/m.sup.2 of each of the Organic EL Devices was measured by using a spectral radiation luminance meter CS-1000, manufactured by Konica Minolta Sensing Inc. The light emission efficiency was measured at 30 minutes and 5 hours after beginning of the heat curing, and the measured results were each expressed by a relative value when the efficiency at the time of 30 minutes after beginning of the curing was set at 100. Furthermore, the light emission situation of the layer surface was observed by an optical microscope. Results of the evaluation are listed in Table 1.

TABLE 1

| Organic EL device No. | Content of organic material with a Tg of not 100° C. or more by mass | Light emission efficiency (Relative value) 0.5 hours after thermal curing | 5 hours after thermal curing | Remarks |
|---|---|---|---|---|
| 1 | 57 | 100 | 65 | Comparative |
| 2 | 88 | 100 | 95 | Inventive |
| 3 | 88 | 100 | 95 | Comparative |

Table 1 shows that the light emission efficiency is considerably lowered in Organic EL Device 1 at the time of after 5 hours from beginning of the thermal curing. Besides, the light efficiency is almost not lowered in Organic EL Devices 2 and 3 at the time of after 5 hours from beginning of the thermal curing. The organic EL devices are not varied depending on the thermal curing time.

According to the observation on the light emitting surface by the optical microscope, many dark spots are caused on Organic EL Device 1, but almost not observed on Organic EL Devices 2 and 3.

On the other hand, the thicknesses of Organic EL Devices 1 and 2 were 0.8 mm and that of Organic EL Device 3 was 1.4 mm. Therefore, Organic EL Device 3 was inferior to the others in the compactness.

It is understood that Organic EL Device 2 using the sealing method and the organic material of the invention is superior in the light emitting property and the compactness of the shape.

Example 2

The organic EL devices prepared in Example 1 were the devices each containing three kinds of light emission substances each different in the wavelength of the emitting light and emitting white light. Situation of the light emission of Organic EL Devices 1 and 2 at the time of 30 minutes after beginning of thermal curing was observed by the microscope. As a result of that, it was observed that Organic EL Device 1 was larger in the ununiformity of color in the light than that in Organic EL Device 2. Namely, it is understood that the Organic EL Device 2 of the invention is a device superior in the chromaticity stability in the light emitting surface.

The organic EL device of the invention gives suitable properties when the device is used as the backlight of a liquid crystal display.

The invention claimed is:

1. A white light emitting organic EL device comprising a substrate;
    a first electrode on the substrate;
    one or more organic layers on the first electrode, the one or more organic layers including a light emission layer unit comprising a blue light emission layer, a green light emission layer, and a red light emission layer, superposed on each other;
    a second electrode on the organic layers;
    an adhesive layer on the second electrode, the adhesive layer extending to the substrate; and
    a flexible film having a barrier layer on a top surface of the adhesive layer;
    wherein
    light is admitted to the device at the flexible film and exits at the substrate;
    a phosphorescence light emission material is in the light emission layer; and
    80% by mass or more of the organic layer is an organic material having a glass transition point, of 100° C. or higher.

2. The white light emitting organic EL device of claim 1, wherein the light emission layer unit further comprises three light emission. materials each having an emission maximum wavelength of 440 to 490 nm, 500 to 540 nm and 600 to 640 nm, and at least two of them are each a phosphorescence light emission material.

3. The white light emitting organic EL device of claim 1, wherein the substrate is a flexible film having an oxygen permeability of not more than $10^{-1}$ ml/m$^2$·24 h MPa and a water vapor permeability of not more than $10^{-3}$ g/m$^2$·24 h.

4. The white light emitting organic EL device of claim 1, which further has an inorganic layer having oxygen permeability not more than $10^{-1}$ ml/m$^2$·24 h and water vapor permeability not more than $10^{-3}$ g/m$^2$·24 h·MPa between the organic layer which is not covered with the second electrode and the adhesion layer.

5. A liquid crystal display which bag the white light emitting organic EL device of claim 1, as a backlight.

6. An illuminating device which has the white light emitting organic EL device of claim 1, as a light source.

7. The white light emitting organic EL device of claim 1, wherein a total thickness of the blue light emission layer, the green light emission layer and the red light emission layer not more than 30 nm.

8. The white light emitting organic EL device of claim 1, wherein a thickness of each of the blue light emission layer, the green light emission layer and the red light emission layer is 2 to 25 nm.

9. The white light emitting organic EL device of claim 1, wherein the blue light emission layer, a green light emission layer and red light emission layer have an emission maximum wavelength of 440 to 490 nm, 500 to 340 nm, and 600 to 640 nm, respectively.

* * * * *